United States Patent
Ebbecke et al.

(10) Patent No.: US 12,426,404 B2
(45) Date of Patent: Sep. 23, 2025

(54) METHOD OF LASER TREATMENT OF A SEMICONDUCTOR WAFER COMPRISING ALGAINP-LEDS TO INCREASE THEIR LIGHT GENERATING EFFICIENCY

(71) Applicant: OSRAM Opto Semiconductors GmbH, Regensburg (DE)

(72) Inventors: Jens Ebbecke, Rohr in Niederbayern (DE); Philipp Kreuter, Teublitz (DE); Christoph Klemp, Regensburg (DE); Andreas Biebersdorf, Regensburg (DE); Ines Pietzonka, Donaustauf (DE); Petrus Sundgren, Lappersdorf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 399 days.

(21) Appl. No.: 17/615,487

(22) PCT Filed: May 19, 2020

(86) PCT No.: PCT/EP2020/063906
§ 371 (c)(1),
(2) Date: Nov. 30, 2021

(87) PCT Pub. No.: WO2020/239526
PCT Pub. Date: Dec. 3, 2020

(65) Prior Publication Data
US 2022/0238752 A1    Jul. 28, 2022

(30) Foreign Application Priority Data
May 31, 2019 (EP) .................................. 19177581

(51) Int. Cl.
*H10H 20/01* (2025.01)
*H10H 20/812* (2025.01)

(52) U.S. Cl.
CPC .......... *H10H 20/01* (2025.01); *H10H 20/013* (2025.01); *H10H 20/812* (2025.01)

(58) Field of Classification Search
CPC ........................ H01L 21/268; H01L 33/0095
See application file for complete search history.

(56) References Cited

U.S. PATENT DOCUMENTS

| 4,731,338 A | 3/1988 | Ralston et al. |
| 4,771,010 A * | 9/1988 | Epler .................. H01L 21/2636 257/E21.333 |

(Continued)

FOREIGN PATENT DOCUMENTS

| CN | 108878612 A | 11/2018 |
| JP | H11261165 A | 9/1999 |

(Continued)

*Primary Examiner* — Ajay Ojha
*Assistant Examiner* — Hajar Kolahdouzan
(74) *Attorney, Agent, or Firm* — Slater Matsil, LLP

(57) ABSTRACT

Embodiments provide a method for treating a semiconductor wafer comprising a set of aluminum gallium indium phosphide light emitting diodes (AlGaInP-LEDs) to increase a light generating efficiency of the AlGaInP-LEDs, wherein each AlGaInP-LED includes a core active layer for light generation sandwiched between two outer layers, the core active layer having a central light generating area and a peripheral edge surrounding the central light generating area, wherein the method includes treating the peripheral edge of the core active layer of each AlGaInP-LED with a laser beam thereby increasing a minimum band gap in each peripheral edge to such an extent that, during operation of the AlGaInP-LED, an electron-hole recombination is essentially confined to the central light generating area.

13 Claims, 2 Drawing Sheets

(56) References Cited

U.S. PATENT DOCUMENTS

| | | |
|---|---|---|
| 2002/0003918 A1 | 1/2002 | Ooi et al. |
| 2010/0022020 A1* | 1/2010 | Halas .................... C03C 17/007 436/171 |
| 2011/0101333 A1* | 5/2011 | Shionoiri .......... H01L 21/76254 257/43 |
| 2015/0104929 A1* | 4/2015 | Lei ...................... H01L 21/3083 156/345.1 |
| 2015/0166397 A1* | 6/2015 | Marjanovic ........ B23K 26/0624 65/112 |
| 2017/0170360 A1* | 6/2017 | Bour ..................... H10H 20/84 |

FOREIGN PATENT DOCUMENTS

| | | | |
|---|---|---|---|
| WO | 03038487 A2 | 5/2003 | |
| WO | WO-2004095662 A2 * | 11/2004 | ............. B82Y 20/00 |

\* cited by examiner

METHOD OF LASER TREATMENT OF A SEMICONDUCTOR WAFER COMPRISING ALGAINP-LEDS TO INCREASE THEIR LIGHT GENERATING EFFICIENCY

This patent application is a national phase filing under section 371 of PCT/EP2020/063906, filed May 19, 2020, which claims the priority of European patent application 19177581.6, filed May 31, 2019, each of which is incorporated herein by reference in its entirety.

TECHNICAL FIELD

The present invention generally relates to the field of manufacturing of light-emitting diode chips.

More particularly, the present invention relates to increasing the light generating efficiency of aluminum gallium indium phosphide LEDs.

BACKGROUND

It is well known that the light generating efficiency of aluminum gallium indium phosphide (AlGaInP) LEDs is limited due to the non-radiant recombination of electron-hole pairs at the LEDs' mesa edge. This problem is particularly salient for very small AlGaInP-LEDs such as those used for high resolution monitors and screens. Indeed, as the size of the AlGaInP-LEDs decreases, their circumference to surface ratio increases, which in turn increases the relative proportion of non-radiant recombination at the mesa edge.

One known approach to solving this problem is to diffuse Zinc into the LED's mesa edge. This Zink diffusion leads to so-called quantum well intermixing, meaning that the bandgap of the optically active material in the LED's mesa edge is increased. This in turn means that less electron-hole pairs can reach the mesa edge. Accordingly, the electron-hole pairs are confined to the LED's center and can recombine optically to generate light.

However, the drawback of diffusing Zinc is an increase in the non-radiant effects in the LED's center.

There is thus a need for a different method of increasing the light generating efficiency of small AlGaInP-LEDs.

SUMMARY

Embodiments provide a method for treating a semiconductor wafer comprising a set of Aluminum Gallium Indium Phosphide light emitting diodes or AlGaInP-LEDs to increase the light generating efficiency of the AlGaInP-LEDs, wherein each AlGaInP-LED includes a core active layer for light generation sandwiched between two outer layers, the core active layer having a central light generating area and a peripheral edge surrounding the central light generating area, the method comprising the step of treating the peripheral edge of the core active layer of each AlGaInP-LED with a laser beam, thus increasing the minimum band gap in each peripheral edge to such an extent that, during later operation of the AlGaInP-LED, the electron-hole recombination is essentially confined to the central light generating area.

By treating the peripheral edges of the core active layers of the AlGaInP-LEDs with a laser beam, non-radiant electron-hole recombination at the LEDs' edges is effectively suppressed. This increases the LEDs' light generating efficiency.

According to one embodiment, the laser beam treatment may involve scanning the wafer with the laser beam according to a predefined pattern.

The photon energy of the laser beam may be higher than the minimum band gap of the core active layer and lower than the band gaps of the two outer layers such that, during the laser beam treatment, the laser beam energy is primarily transferred to the core active layer's peripheral edge.

Each AlGaInP-LED may be a red light LED.

The wavelength of the laser beam may in particular be in the range of 550 to 640 nm.

The laser beam may have a Gaussian shape/profile.

The laser beam may be generated by a pulsed laser.

Prior to the laser beam treatment, the wafer may be heated to a background temperature to reduce the power requirements of the laser beam treatment.

The laser beam power density may be between 0.1 and 100 mJ/mm2, and preferably between 1 and 10 mJ/mm2.

After the laser beam treatment, the wafer may be etched, thus obtaining, for each AlGaInP-LED, a chip preform, wherein, preferably, after the etching, the wafer is diced into individual AlGaInP-LED chips, e.g. by laser cutting.

The duration of the laser beam treatment may be between is and 10 min and preferably between 10 s and 2 min.

BRIEF DESCRIPTION OF THE DRAWINGS

The present disclosure will now be described in detail with reference to the accompanying drawings, in which.

DETAILED DESCRIPTION OF ILLUSTRATIVE EMBODIMENTS

Figure 1:
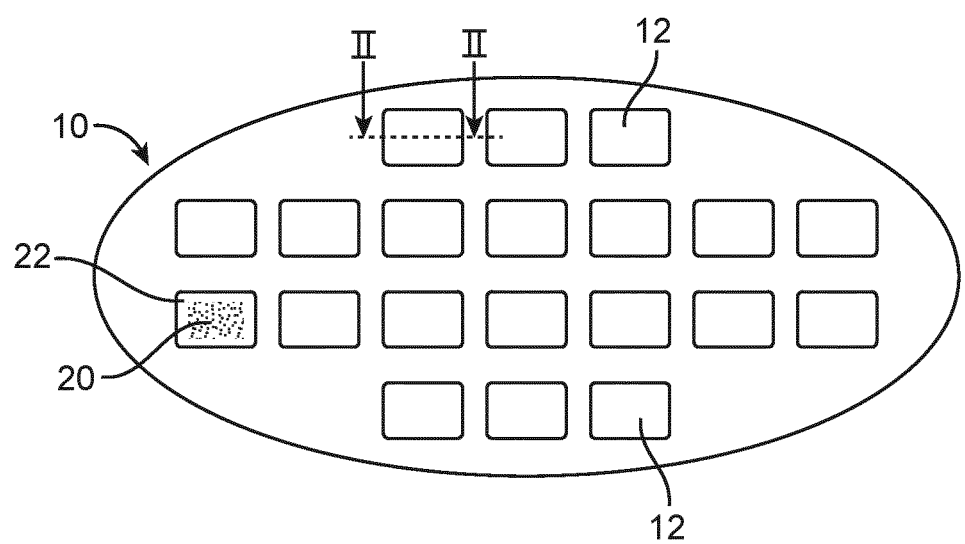
FIG. 1 is a schematic representation of a semiconductor wafer prior to being subjected to the method of the present disclosure.

With reference to FIG. 1, there is shown a semiconductor wafer 10 comprising a set of aluminum gallium indium phosphide light-emitting diodes (AlGaInP-LEDs) 12. In the example of FIG. 1, there are twenty LEDs 12 arranged in the wafer 10. Each LED is a PN junction, which has been formed in the wafer 10 according to well-known methods.

Figure 2:
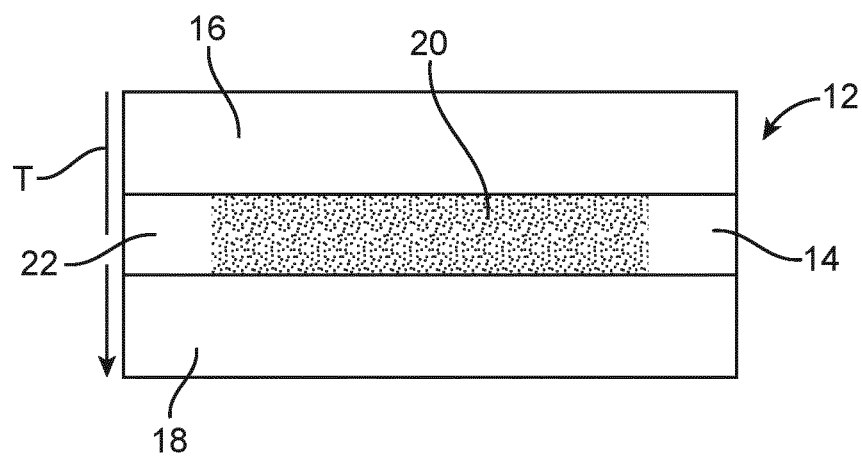
FIG. 2 is a cross-sectional view according to the arrows II of FIG. 1 of one AlGaInP-LED, which is part of the wafer of FIG. 1.

FIG. 2 is a cross section of one of the LEDs 12. Each LED 12 includes a core active layer 14 for light generation sandwiched between two outer layers 16 and 18. The core active layer 14 has a central light generating area 20. This area 20 is identified by the dotted region. The central light generating area 20 is surrounded by a peripheral edge 22.

Figure 4:
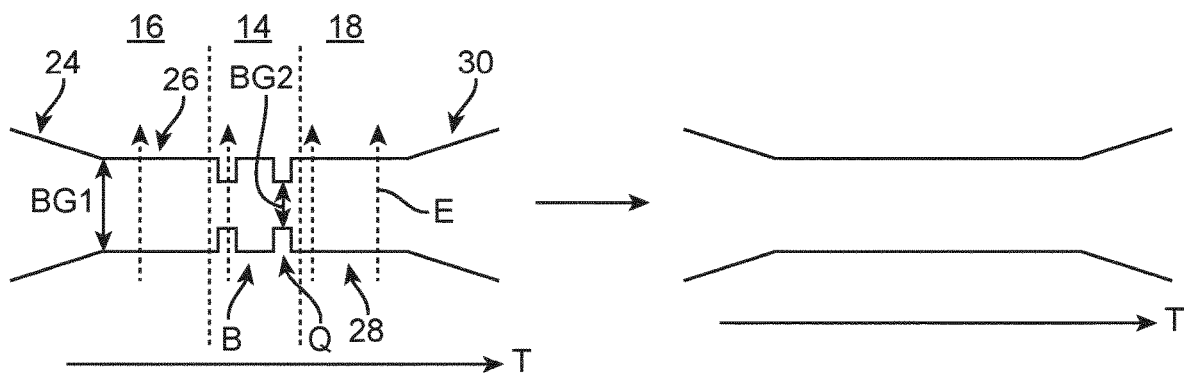
FIG. 4 shows the effects of the method of the present disclosure on the bandgap shape of the peripheral edge of the core active layer of an AlGaInP-LED.

With reference to the left part of FIG. 4, we will now describe the bandgap structure of the LED 12 shown in FIG. 2. The bandgap diagram in Figure 4 shows the bandgap as a function of the depth T into the LED 12, see FIG. 2. The upper outer layer 16 of the LED 12 is a P-doped layer. The bandgap shape of this P-type doped layer 16 is a P-ramp 24, followed by a P-setback 26. The bandgap of the P-setback 26 is denoted by BG1. The bandgap shape of the active layer 14 is, along the depth T, a series of quantum wells Q separated by barriers B. In the example shown in Figure 4, active layer 14 has two quantum wells Q separated by one barrier B. The quantum wells Q define a bandgap BG2, which is smaller than the bandgap BG1. The bandgap of the quantum wells Q is the minimum bandgap of the core active layer 14. The lower outer layer 18 has a bandgap shape comparable to the one of the upper outer layer 16, with a setback 28, and ramp 30. However, the lower outer layer 18 is N-type doped.

Figure 3:
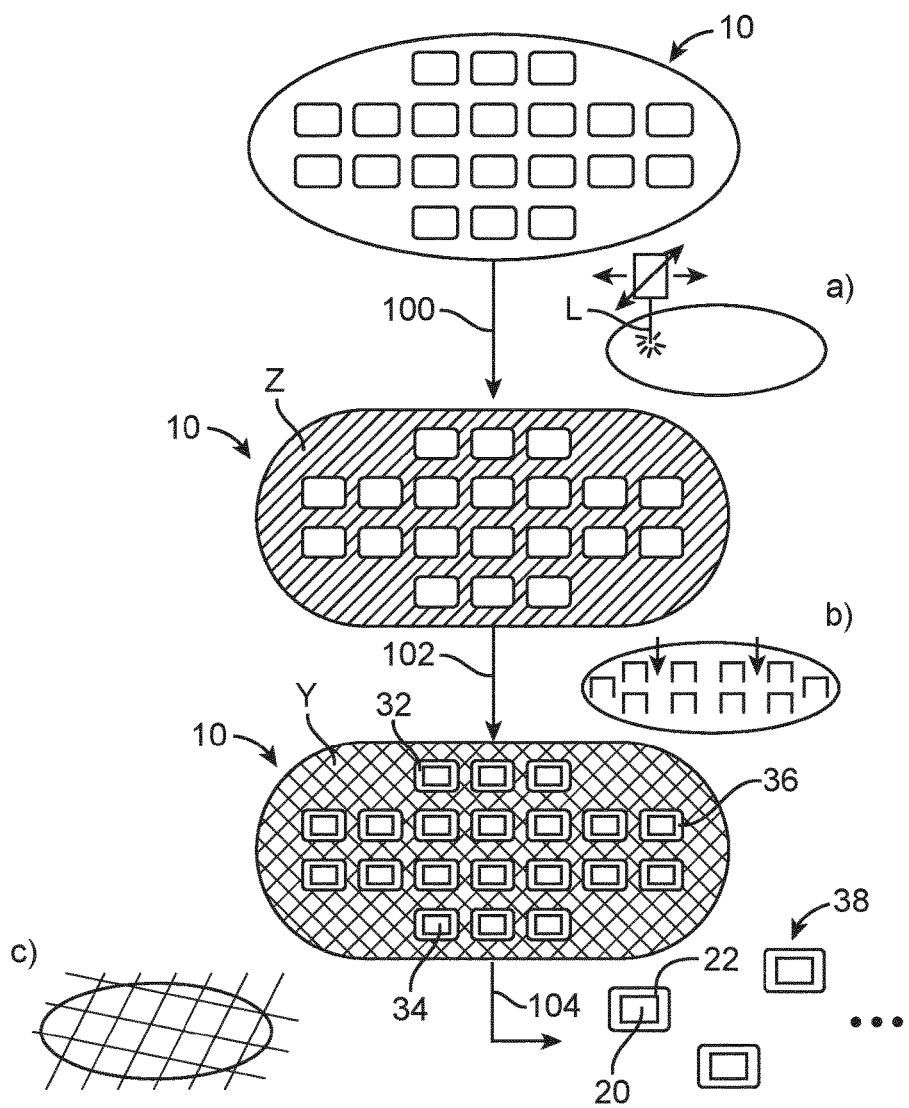
FIG. 3 is a flow diagram showing the steps of obtaining individual AlGaInP-LED chips, starting from the wafer shown in FIG. 1, and involving the process of the present disclosure.

Turning now to FIG. 3, individual LED chips 38 with increased light generating efficiency are obtained from the wafer 10 as follows:

In a first step a), a hatched zone Z of the wafer 10 is treated with a laser beam L, as depicted in the small process drawing located right to the flow diagram's first arrow 100. The laser beam treatment involves scanning wafer 10 according to a predefined pattern. More precisely, the laser beam L scans the surface of the wafer 10, which is not taken up by the LEDs 12, and, on top of that, the peripheral edges 22 of the core active layers 14 of the LEDs 12. Different scanning patterns are possible, as long as the pattern involves the scanning of the peripheral edges 22 of the core active layers 14 of the LEDs 12.

The photon energy of the laser beam L is higher than the minimum bandgap BG2 of the core active layer 14 and lower than the bandgap BG1 of the two outer layers 16 and 18. Hence, during the laser beam treatment, the laser beam energy is primarily transferred to the core active layer's peripheral edge 22.

The laser beam's wavelength is chosen in particular such that only the quantum wells Q, the barriers B and the setbacks 26, 28 are optically stimulated, as illustrated by the arrows E in FIG. 4. For example, the wavelength of the laser beam may be chosen anywhere within the range of 550 to 640 nm.

Furthermore, the shape or profile of the laser beam may in particular correspond to a Gaussian profile.

The laser beam may be a pulsed laser, such as a nano- pico- or femtosecond laser. The power density of the laser beam may be between 0.1 and 100 mJ per mm2, and preferably between 1 and 10 mJ per mm2. The overall duration of the wafer's laser beam treatment may be between 1 second and 10 minutes, and preferably between 10 seconds and 2 minutes.

The effect of the laser beam treatment on the bandgap structure is shown on the right hand side of FIG. 4. It is apparent that the laser beam L, by locally heating the treated area, effectively destroys the quantum wells Q. Hence, after the laser beam treatment, the peripheral edges 22 no longer have any core active layer 14. The laser beam treatment results in a mixing of the quantum well material with the barrier material (so-called quantum well intermixing), which increases the bandgap.

After the laser beam treatment 100, the semiconductor wafer 10 may be etched (so-called "Mesa etching"), thus obtaining for each LED 12, a chip preform 32. The etching step 102 is identified by the letter b) in FIG. 3. The etched parts of the wafer 10 are highlighted by a crosshatch pattern Y. Each chip preform 32 has a central zone 34 and a peripheral boundary 36. The peripheral boundary 36 has been laser treated and thus lacks any core active layer 14. In contrast thereto, the central zone 34 still has a core active layer 14.

In order to obtain individual LED chips 38, wafer 10 is diced, e.g. by laser cutting, as shown in step 104 of FIG. 3.

The laser treatment step wo may optionally be preceded by a step of heating the semiconductor wafer 10 to a background temperature to reduce the power requirements of the laser beam treatment.

Thanks to the laser beam treatment of the present disclosure, during operation of the LED chips 38, the electron-hole recombination is essentially confined to the central light generating area 20. This is because of the increased bandgap in the peripheral edges 22, which prevents electron-hole pairs from entering the same.

The laser treatment method of the present disclosure is especially useful for very small red LEDs, which are e.g. used as part of high resolution monitors and displays.

Although the invention has been illustrated and described in detail by means of the preferred embodiment examples, the present invention is not restricted by the disclosed examples and other variations may be derived by the skilled person without exceeding the scope of protection of the invention.

The invention claimed is:

1. A method for treating a semiconductor wafer comprising a set of aluminum gallium indium phosphide light emitting diodes (AlGaInP-LEDs), wherein each AlGaInP-LED includes a core active layer for light generation sandwiched between two outer layers, the core active layer having a central light generating area and a peripheral edge surrounding the central light generating area, the method comprising:
   treating, by a laser beam treatment, the peripheral edge of the core active layer of each AlGaInP-LED with a laser beam thereby increasing a minimum band gap in each peripheral edge to such an extent that, during operation of the AlGaInP-LED, an electron-hole recombination is essentially confined to the central light generating area; and
   after the laser beam treatment, mesa etching the wafer thereby obtaining, for each AlGaInP-LED, a chip preform, wherein each chip preform comprises a central zone and a laser beam treated peripheral boundary,
   wherein a photon energy of the laser beam is higher than the minimum band gap of the core active layer and lower than band gaps of the two outer layers such that, during the laser beam treatment, a laser beam energy is primarily transferred to the peripheral edge of the core active layer.

2. The method of claim 1, wherein the laser beam treatment involves scanning the wafer with the laser beam according to a predefined pattern.

3. The method of claim 1, wherein each AlGaInP-LED is a red light LED.

4. The method of claim 1, wherein a wavelength of the laser beam is chosen within a range of 550 to 640 nm.

5. The method of claim 1, wherein the laser beam comprises a Gaussian profile.

6. The method of claim 1, wherein the laser beam is generated by a pulsed laser.

7. The method of claim 1, further comprising, prior to the laser beam treatment, heating the wafer to a background temperature to reduce power requirements of the laser beam treatment.

8. The method of claim 1, wherein a laser beam power density is between 0.1 and 100 mJ/mm$^2$, inclusive.

9. The method of claim 1, wherein a laser beam power density is between 1 and 10 mJ/mm$^2$, inclusive.

10. The method of claim 1, further comprising:
    after etching, dicing the wafer into individual AlGaInP-LED chips.

11. The method of claim 10, wherein dicing comprises laser cutting.

12. The method of claim 1, wherein a duration of the laser beam treatment is between 1 s and 10 min.

13. The method of claim 1, wherein a duration of the laser beam treatment is between 10 s and 2 min.

\* \* \* \* \*